United States Patent
Lyons et al.

(10) Patent No.: US 7,115,440 B1
(45) Date of Patent: Oct. 3, 2006

(54) $SO_2$ TREATMENT OF OXIDIZED CUO FOR COPPER SULFIDE FORMATION OF MEMORY ELEMENT GROWTH

(75) Inventors: Christopher F. Lyons, Fremont, CA (US); Ramkumar Subramanian, Sunnyvale, CA (US); Sergey D. Lopatin, Santa Clara, CA (US); James J. Xie, San Jose, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 199 days.

(21) Appl. No.: 10/957,247

(22) Filed: Oct. 1, 2004

(51) Int. Cl.
*H01L 21/00* (2006.01)

(52) U.S. Cl. .................. 438/104; 438/99; 438/687

(58) Field of Classification Search ............ 438/104, 438/99, 657, 687
See application file for complete search history.

(56) References Cited

U.S. PATENT DOCUMENTS

| | | | |
|---|---|---|---|
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B1 | 7/2004 | Krieger et al. | |
| 6,770,905 B1 | 8/2004 | Buynoski et al. | |
| 6,773,954 B1 | 8/2004 | Subramanian et al. | |
| 6,781,868 B1 | 8/2004 | Bulovic et al. | |
| 6,787,458 B1 | 9/2004 | Tripsas et al. | |
| 6,916,696 B1 * | 7/2005 | Buynoski .................. | 438/200 |

* cited by examiner

*Primary Examiner*—Mary Wilczewski
*Assistant Examiner*—Seth Barnes
(74) *Attorney, Agent, or Firm*—Amin & Turocy, LLP

(57) ABSTRACT

Disclosed are methods of making memory cells and semiconductor devices containing the memory cells. The methods involve oxidizing a portion of a copper containing electrode to form a copper oxide layer; contacting the copper oxide layer with at least one of a sulfur containing gas or plasma to form a CuS layer; forming an organic semiconductor over the CuS layer; and forming an electrode over the organic semiconductor. Such devices containing the memory cells are characterized by light weight and robust reliability.

20 Claims, 3 Drawing Sheets

SO₂ TREATMENT OF OXIDIZED CUO FOR COPPER SULFIDE FORMATION OF MEMORY ELEMENT GROWTH

TECHNICAL FIELD

The present invention generally relates to using a gaseous treatment to form passive layers in organic memory devices. In particular, the present invention relates to CuS passive layers formed by an $SO_2$ treatment in memory devices containing an organic semiconductor.

BACKGROUND ART

The basic functions of a computer and memory devices include information processing and storage. In typical computer systems, these arithmetic, logic, and memory operations are performed by devices that are capable of reversibly switching between two states often referred to as "0" and "1". Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses. Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides organic memory devices containing organic memory cells having a CuS layer formed by an $SO_2$ treatment of a copper oxide surface, such as an oxidized surface of a copper containing electrode. Consequently, the thickness of the CuS layer is relatively small and controllable, compared with forming CuS layers by other methods. The use of dangerous compounds to form a CuS layer, such as $H_2S$, is mitigated and/or eliminated. Moreover, since the CuS layer may be formed within an electrode, delamination concerns are mitigated.

The organic memory devices containing the organic memory cells having a CuS layer possess one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the invention is a method of making a memory cell involving oxidizing a portion of a copper containing electrode to form a copper oxide layer; contacting the copper oxide layer with at least one of a sulfur containing gas or plasma to form a CuS layer; forming an organic semiconductor over the CuS layer; and forming an electrode over the organic semiconductor.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The present invention involves using a sulfur treatment to form CuS layers or regions in organic memory cells made of two electrodes with a controllably conductive media between the two electrodes. The controllably conductive media contains an organic semiconductor layer and the CuS layer, the latter formed by the sulfur treatment of an oxidized surface. Specifically, copper in an electrode is oxidized to form copper oxide, than the copper oxide is efficiently converted to copper sulfide. The organic memory cells may optionally contain additional layers, such as additional electrodes, charge retention layers, and/or chemically active layers.

The impedance of the controllably conductive media changes when an external stimulus such as an applied electric field is imposed. A plurality of organic memory cells, which may be referred to as an array, form an organic memory device. In this connection, organic memory cells may form an organic memory device and function in a manner analogous to metal oxide semiconductor field effect transistors (MOSFETs) in conventional semiconductor memory devices. However, there are advantages to using the organic memory cells instead of conventional MOSFETs in memory devices.

It is noted that the term CuS layer or region refers to a portion of a memory element or memory cell that contains $Cu_xS_y$, as a conductivity facilitating compound, where x and y are independently from about 0.5 to about 4. In another embodiment, x and y are independently from about 0.75 to about 3. Common examples of $Cu_xS_y$ compounds include $CuS_2$, $Cu_2S_3$, $CuS$, $Cu_{1.5}S$, $Cu_2S$, $Cu_{2.5}S$, $Cu_3S$, and the like. For simplicity and brevity, all such copper sulfide layers falling within the noted $Cu_xS_y$ formula are generically referred to as CuS layers.

Figure 1:
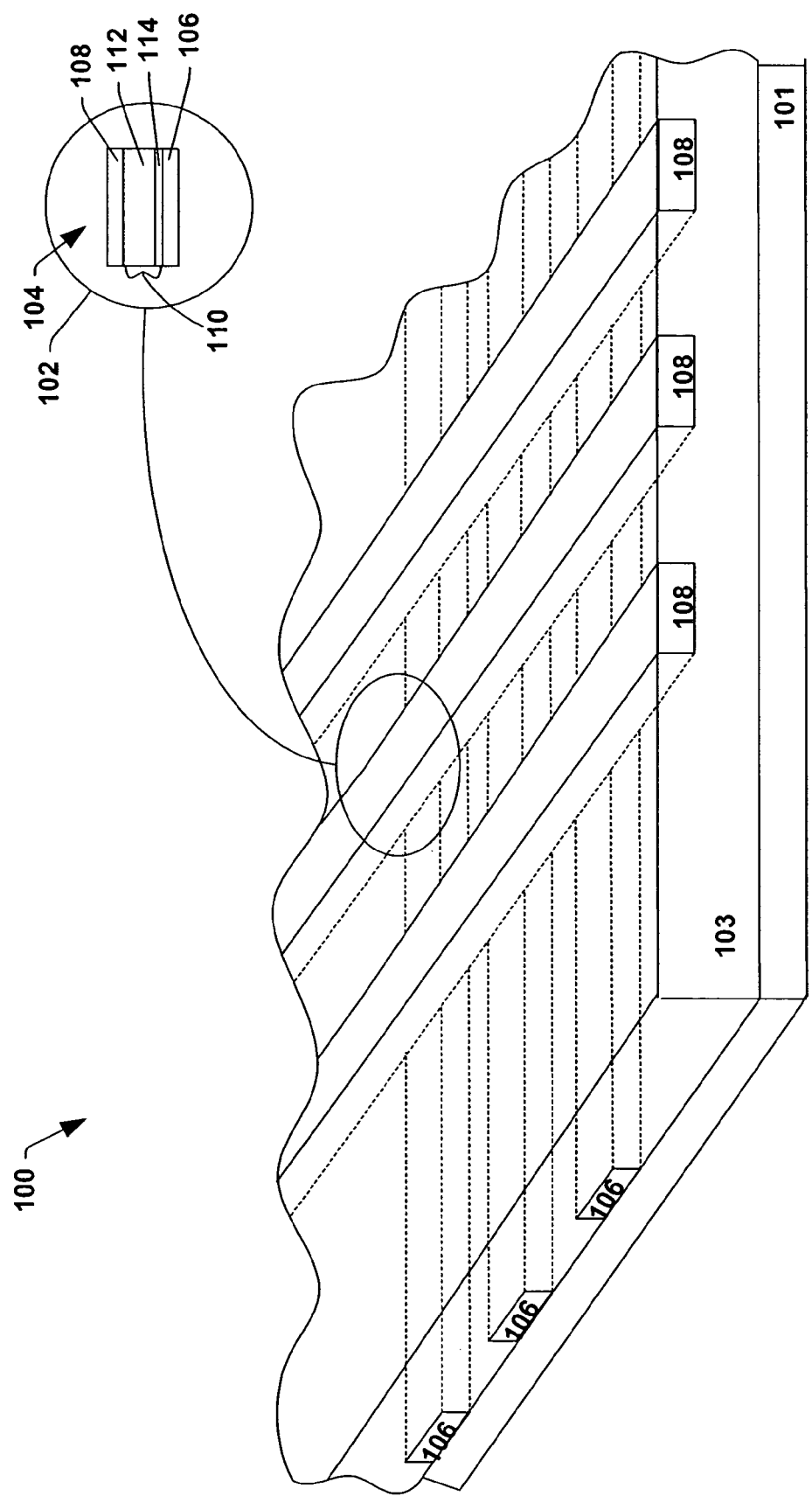
FIG. 1 illustrates a perspective view of a microelectronic device containing a plurality of organic memory cells in accordance with one aspect of the invention.
Figure 2:
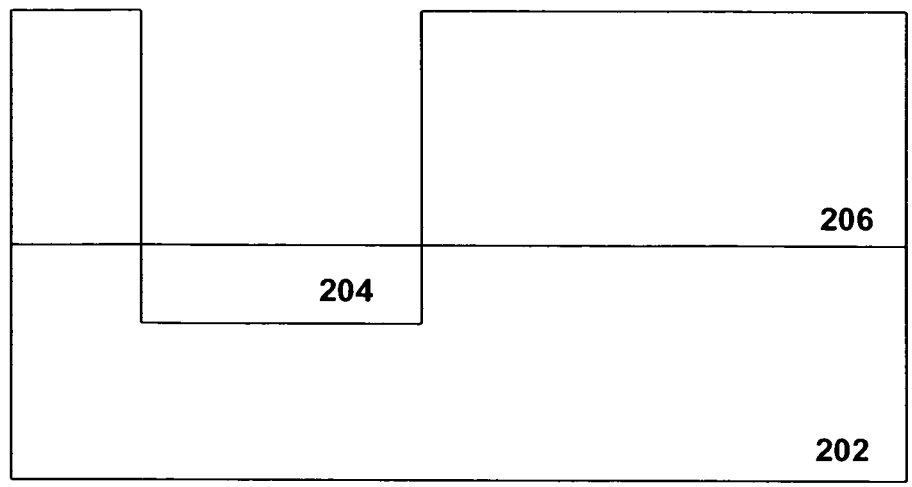
FIG. 2 illustrates a cross sectional view of a method of forming an organic memory cell in accordance with another aspect of the invention.

Referring to FIG. 1, a brief description of a microelectronic organic memory device 100 containing a plurality of organic memory cells on a substrate 101 in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The organic memory cells are formed in a polymer dielectric 103, which is formed over a substrate 101. The first electrodes 106 and the second electrodes 108 are shown in substantially perpendicular orientation, although other orientations are possible to achieve the structure of the exploded view 102. Each organic memory cell 104 contains a first electrode 106 containing copper and a second electrode 108 with a controllably conductive media 110 therebetween. The controllably conductive media 110 contains an organic semiconductor layer 112 and CuS layer 114 that is formed by implantation techniques. Peripheral circuitry and devices are not shown for brevity.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like. However, the electrode that is adjacent the CuS layer contains at least copper, so as to permit formation of a CuS layer by a sulfur treatment. In one embodiment, the electrode that is adjacent the CuS layer contains at least 50% by weight copper.

Examples of materials for the electrode that is not adjacent the CuS layer include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys. One or more of these materials may be present in combination with copper in the electrode that is adjacent the CuS layer.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

Active devices of organic semiconductor devices and polymer memory devices contain an organic semiconductor and a CuS layer, which together can constitute a controllably conductive media. The controllably conductive media can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more CuS layers. The CuS of the CuS layer acts a conductivity facilitating compound in conjunction with the organic semiconductor layers. In one embodiment, the controllably conductive media contains at least one organic semiconductor layer that is adjacent a CuS layer (without any intermediary layers between the organic semiconductor layer and CuS layer).

Examples of conductivity facilitating compounds include one or more of the above mentioned $Cu_xS_y$ compounds such as $CuS_2$, $Cu_2S_3$, $CuS$, $Cu_{1.5}S$, $Cu_2S$, $Cu_{2.5}S$, $Cu_3S$, and the like. The conductivity facilitating compounds do not necessarily dissociate into ions under the strength of the electric field, although ions may move through them. The CuS layer may contain two or more subCuS layers, each sublayer containing the same, different, or multiple conductivity facilitating compounds.

The CuS layer is formed on an electrode that contains copper. Generally speaking, the CuS layer is formed using oxidation techniques and gas phase reactions. The electrode containing copper is oxidized so that a relatively thin copper oxide layer is formed thereover. Oxidation may be performed by a liquid treatment, a gas treatment, or a plasma treatment. That is, the liquid, gas, or plasma contains at least one oxidizing compound. Examples of liquid treatments include contacting the electrode containing copper with one or more of hydrogen peroxide, water, oxygenated water, and the like. Examples of gas and plasma treatments include contacting the electrode containing copper with one or more of steam, oxygen, ozone, $N_2O$, and the like. Examples of oxidizing compounds accordingly include hydrogen peroxide, water, oxygenated water, steam, oxygen, ozone, $N_2O$, and the like. In one embodiment, the plasma/gas treatment may further contain at least one inert gas, such as nitrogen, and the noble gases. Noble gases include argon, helium, neon, krypton, and xenon.

In one embodiment, the CuO layer has a thickness of about 2 Å or more and about 0.1 µm or less. In another embodiment, the CuO layer has a thickness of about 10 Å or more and about 0.01 µm or less. In yet another embodiment, the CuO layer has a thickness of about 50 Å or more and about 0.005 µm or less. The CuO layer may contain additional metal oxides in addition to copper, especially in instances where the electrode contains copper and another metal.

The oxidized copper layer is subject to a sulfur treatment to convert the copper oxide to copper sulfide. The sulfur treatment involves contacting the CuO layer with a sulfur containing gas and/or plasma. Examples of sulfur containing gases and/or plasmas include $SO_2$, $SO_3$, and the like.

The sulfur plasma/gas may be derived from any suitable sulfur containing source. For example, liquid sulfur trioxide, which is primarily in gamma form, may be used as a source for sulfur trioxide gas and plasma. In general, stabilized gamma sulfur trioxide is used, where addition of a small quantity of inhibitor (stabilizer) prevents formation of the high melting-point beta and alpha forms. However, the beta and alpha forms sulfur trioxide may be employed. Gamma sulfur trioxide is commercially available with such inhibitors. Gaseous sulfur dioxide is commercially available.

Sulfur containing gas/plasma is contacted with the CuO layer for a time sufficient for the sulfur gas/plasma to convert a substantial portion of the CuO to CuS. The time of which the sulfur gas/plasma is contacted with the CuO layer is typically from about 1 second to about 1 hour. In another embodiment, the sulfur gas/plasma is contacted with the CuO layer for a period of time from about 5 seconds to about 10 minutes.

In one embodiment, the sulfur containing plasma/gas also contains at least one inert gas, such as nitrogen, and the noble gases. In one embodiment where a plasma is employed, the plasma contains from about 10 sccm to about 10 slm of sulfur dioxide and/or trioxide and from about 0 sccm to about 10 slm of at least one inert gas. In another embodiment, the plasma contains from about 25 sccm to about 5 slm of sulfur dioxide and/or trioxide and from about 10 sccm to about 10 slm of at least one inert gas.

In one embodiment where a gas is employed, the gas contains from about 1% to about 100% by weight of sulfur dioxide and/or trioxide and from about 0% to about 99% by weight of at least one inert gas. In another embodiment, the gas contains from about 3% to about 95% by weight of sulfur dioxide and/or trioxide and from about 5% to about 97% by weight of at least one inert gas.

Any suitable pressure may be employed when using the sulfur containing plasma/gas. In one embodiment, the pressure in the processing chamber is from about 0.0001 Torr to about 1,000 Torr when using a plasma. In another embodiment, the pressure in the processing chamber is from about 0.001 Torr to about 500 Torr when using a plasma. In one embodiment, the pressure in the processing chamber is from about 10 Torr to about 1,500 Torr when using a gas. In another embodiment, the pressure in the processing chamber is from about 25 Torr to about 1,000 Torr when using a gas.

The temperature during contact between the sulfur plasma/gas and the CuO layer is typically from about 10° C. to about 500° C. In one embodiment, the temperature during contact between the sulfur plasma/gas and the CuO layer is from about 20° C. to about 400° C. The temperature is maintained to maximize the conversion of CuO to CuS, while not substantially damaging or degrading the underlying electrode.

In some instances, to promote long charge retention times (in the organic semiconductor layer), the CuS layer may be treated with a plasma after it is formed. The plasma treatment modifies the energy barrier of the CuS layer. In one embodiment, the CuS layer is formed without using $H_2S$. This can be advantageous since $H_2S$ is a poisonous substance, the use of which is disfavored.

In one embodiment, the CuS layer containing the conductivity facilitating compound has a thickness of about 2 Å or more and about 0.1 µm or less. In another embodiment, the CuS layer has a thickness of about 10 Å or more and about 0.01 µm or less. In yet another embodiment, the CuS layer has a thickness of about 50 Å or more and about 0.005 µm or less.

A covalent bond may be formed between the organic semiconductor material and the CuS layer. Alternatively, close contact is required to provide good charge carrier/electron exchange between the organic semiconductor layer and the CuS layer. The organic semiconductor layer and the CuS layer are electrically coupled in that charge carrier/electron exchange occurs between the two layers.

Organic semiconductors thus have a carbon based structure, often a carbon-hydrogen based structure, which is different from conventional MOSFETs. In this connection, the organic semiconductor layer, such as a conjugated organic polymer, has the ability to donate and accept charges (holes and/or electrons). Generally, the organic semiconductor or an atom/moiety in the polymer has at least two relatively stable states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit. The polymer backbone of the conjugated organic polymer extends lengthwise between the electrodes. The conjugated organic polymer may be linear or branched, so long as the polymer retains its conjugated nature.

In yet another embodiment, the organic semiconductor contains an organometallic polymer (such as a conjugated organometallic polymer), or carbon structures such as carbon nanotubes and buckyballs. A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single wall nanotubes. A buckyball is more specifically a Buckminster-fullerene, a soccerball shaped 60-atom or 70-atom cluster of pure carbon.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/CuS layer.

The CuS layer may in some instances act as a catalyst when forming the organic semiconductor layer, particularly when the organic semiconductor layer contains a conjugated organic polymer. In this connection, the polymer backbone of the conjugated organic polymer may initially form adjacent the CuS layer, and grow or assemble away and substantially perpendicular to the CuS layer surface. As a result, the polymer backbones of the organic polymers may be self aligned in a direction that traverses the electrodes or in a direction away from the CuS layer.

Referring to FIGS. 2 to 5, fabrication of a memory cell in accordance with the present invention is described. Specifically referring to FIG. 2, a structure 200 is provided containing a substrate 202, an electrode 204 containing at least copper, and a dielectric material 206 over the substrate. An opening exists in the dielectric material 206 over at least a portion of the electrode 204.

Figure 3:
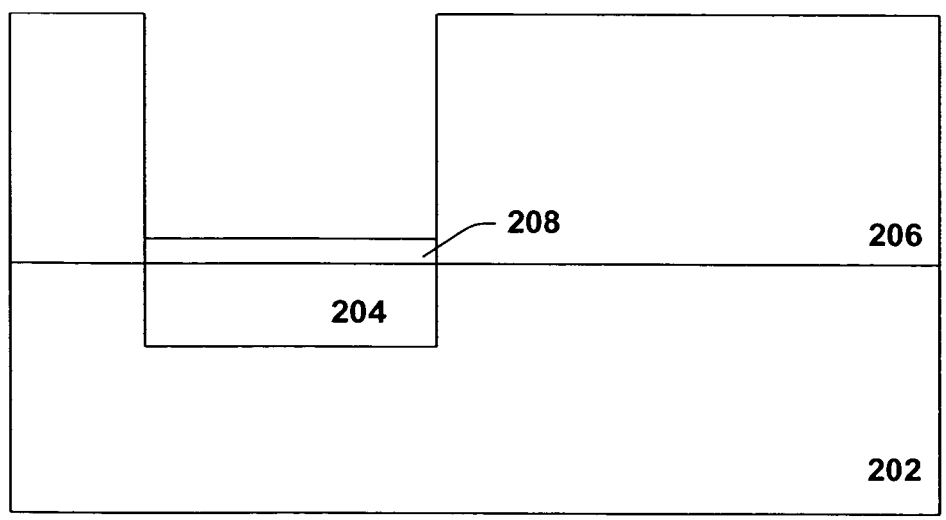
FIG. 3 illustrates a cross sectional view of a method of forming an organic memory cell in accordance with yet another aspect of the invention.

Referring to FIG. 3, structure 200 is exposed to at least one of an oxidizing liquid, gas or plasma. Specific examples include a liquid containing hydrogen peroxide and water, a gas containing at least oxygen and/or $N_2O$, and a plasma containing at least oxygen and/or $N_2O$. Through the opening in the dielectric material 206, the oxidizing liquid, gas or plasma generates a relatively thin film of copper oxide 208 on the electrode 204, by oxidizing copper atoms at the surface of the electrode 204.

Figure 4:
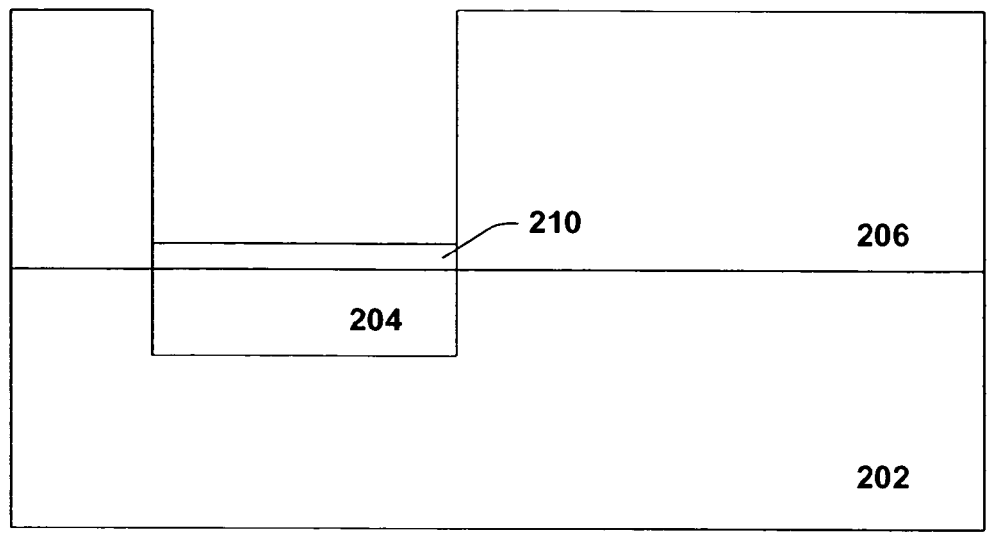
FIG. 4 illustrates a cross sectional view of a method of forming an organic memory cell in accordance with still yet another aspect of the invention.

Referring to FIG. 4, structure 200 is exposed to at least one of a sulfur containing gas or plasma. A specific example includes a gas or plasma containing sulfur dioxide. Through the opening in the dielectric material 206, the sulfur containing gas or plasma changes the relatively thin film of copper oxide 208 to a relatively thin film of CuS 210. During this process, a vacuum may be employed to remove any oxygen generated by the change of copper oxide to CuS.

Figure 5:
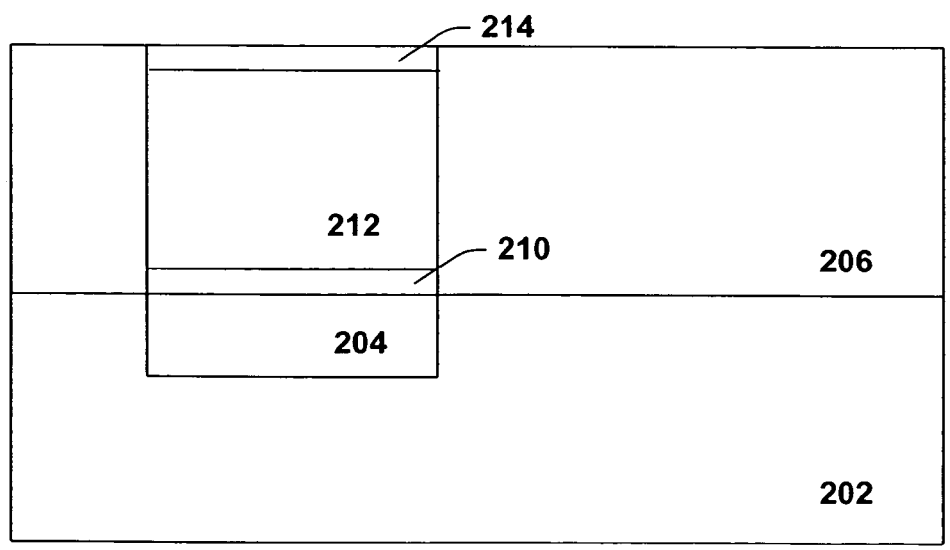
FIG. 5 illustrates a cross sectional view of a method of forming an organic memory cell in accordance with another aspect of the invention.

Referring to FIG. 5, a polymer is deposited over structure 200 and specifically into the opening in the dielectric material 206, where it forms an organic semiconductor 212. In some instances, the thin film of CuS 210 facilitates the orderly growth and alignment of the organic polymer in position normal to the surface of the film of CuS 210. A second electrode 214 is then formed over the organic semiconductor 212 to complete the fabrication of a memory cell.

A CuS layer contains at least one conductivity facilitating compound that contributes to the controllably conductive properties of the controllably conductive media. The conductivity facilitating compound has the ability to donate and accept charges (holes and/or electrons) and/or act as a source of copper ions. The CuS layer thus may transport holes, electrons, and/or ions between an electrode and the organic polymer layer/CuS layer interface, facilitate charge/carrier injection into the organic polymer layer, and/or increase the concentration of a charge carrier (ions, holes and/or electrons) in the organic polymer layer. In some instances, the CuS layer may store opposite charges thereby providing a balance of charges in the organic memory device as a whole. Storing charges/charge carriers is facilitated by the existence of two relatively stable oxidation states for the conductivity facilitating compound.

The Fermi level of the CuS layer is close to the valence band of the organic semiconductor layer. Consequently, the injected charge carrier (into the organic semiconductor layer) may recombine with the charge at the CuS layer if the energy band of the charged organic semiconductor layer does not substantially change. Positioning energy bands involves compromising between ease of charge injection and length of charge (data) retention time.

The applied external field can reduce the energy barrier between the CuS layer and organic layer depending on the field direction. Therefore, enhanced charge injection in the forward direction field in programming operation and also enhanced charge recombination in reversed field in erase operation can be obtained.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factors including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the organic memory cell; whereas external stimuli that do not exceed a threshold value do not write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage opposite in polarity to the writing signal, that exceeds a threshold value, is applied.

Examples of active devices of organic semiconductor devices and polymer memory devices include nonvolatile organic memory cells, organic semiconductor transistors, polymer semiconductor transistors, nonvolatile polymer memory cells, programmable organic memory cells, and the like. Generally, these active devices contain an organic semiconductor between two electrodes, or an organic semiconductor surrounded by three electrodes. The integrated circuit chips described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

The organic semiconductor devices are useful in any device requiring memory. For example, the organic semiconductor devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a memory cell, comprising:
providing a first electrode comprising at least copper;
oxidizing a portion of the first electrode to form a copper oxide layer on the first electrode;
contacting the copper oxide layer with at least one of a sulfur containing gas and a sulfur containing plasma to convert at least a substantial portion of the copper oxide layer to a CuS layer;
forming an organic semiconductor over the CuS layer; and
forming a second electrode over the organic semiconductor.

2. The method of claim 1, wherein the first electrode is oxidized with a liquid comprising at least one selected from the group consisting of hydrogen peroxide, water, and oxygenated water.

3. The method of claim 1, wherein the first electrode is oxidized with a gas or plasma comprising at least one selected from the group consisting of steam, oxygen, ozone, and $N_2O$.

4. The method of claim 1, wherein the sulfur containing gas comprises at least one selected from the group consisting of $SO_2$ and $SO_3$.

5. The method of claim 1, wherein the sulfur containing plasma comprises at least one selected from the group consisting of $SO_2$ and $SO_3$.

6. The method of claim 1, wherein the copper oxide layer is contacted with at least one of a sulfur containing gas and a sulfur containing plasma at a temperature from about 10° C. to about 500° C. for a time from about 5 seconds to about 10 minutes.

7. The method of claim 1, wherein the CuS layer comprises at least one compound represented by the formula $Cu_xS_y$, where x and y are independently from about 0.5 to about 4.

8. The method of claim 1, wherein the CuS layer is treated with a plasma before forming the organic semiconductor over the CuS layer.

9. The method of claim 1, wherein the organic semiconductor comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)

diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

10. A method of making a memory cell, comprising:
providing a first electrode comprising at least 50% by weight copper;
contacting the first electrode with an oxidizing compound to form a copper oxide layer on the first electrode;
contacting the copper oxide layer with at least one of a sulfur containing gas and a sulfur containing plasma to convert at least a substantial portion of the copper oxide layer to a CuS layer;
forming an organic semiconductor over the CuS layer; and
forming a second electrode over the organic semiconductor.

11. The method of claim 10, wherein the oxidizing compound is selected from the group consisting of hydrogen peroxide, water, oxygenated water, steam, oxygen, ozone, and $N_2O$.

12. The method of claim 10, wherein the copper oxide layer has a thickness of about 10 Å or more and about 0.01 μm or less.

13. The method of claim 10, wherein the sulfur containing plasma contains from about 10 sccm to about 10 slm of sulfur dioxide and from about 0 sccm to about 10 slm of at least one inert gas; the sulfur containing plasma contacting the copper oxide layer at a temperature from about 10° C. to about 500° C. for a time from about 1 second to about 1 hour.

14. The method of claim 10, wherein the sulfur containing gas comprises from about 1% to about 100% by weight of sulfur dioxide and from about 0% to about 99% by weight of at least one inert gas; the sulfur containing gas contacting the copper oxide layer at a temperature from about 10° C. to about 500° C. for a time from about 1 second to about 1 hour.

15. The method of claim 10, wherein the CuS layer has a thickness of about 10 Å or more and about 0.01 μm or less.

16. The method of claim 10, wherein the organic semiconductor comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polytbiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

17. A method of making a memory cell, comprising:
providing a first electrode comprising at least copper;
oxidizing a portion of the first electrode to form a copper oxide layer on the first electrode;
contacting the copper oxide layer with at least one of a sulfur dioxide containing gas and a sulfur dioxide containing plasma to convert at least a substantial portion of the copper oxide layer to a CuS layer;
forming an organic semiconductor comprising a conjugated organic polymer over the CuS layer; and
forming a second electrode over the organic semiconductor.

18. The method of claim 17, wherein the first electrode is oxidized with at least one of a liquid comprising at least one selected from the group consisting of hydrogen peroxide, water, and oxygenated water; a gas comprising at least one selected from the group consisting of steam, oxygen, ozone, and $N_2O$; and a plasma comprising at least one selected from the group consisting of steam, oxygen, ozone, and $N_2O$.

19. The method of claim 17, wherein the copper oxide layer is contacted with a sulfur dioxide containing gas comprising from about 3% to about 95% by weight of sulfur dioxide and from about 5% to about 97% by weight of at least one inert gas.

20. The method of claim 17, with the proviso that the copper oxide layer is not contacted with $H_2S$.

* * * * *